(12) United States Patent
Takagi et al.

(10) Patent No.: US 11,412,615 B2
(45) Date of Patent: Aug. 9, 2022

(54) ELECTRONIC COMPONENT AND METHOD OF PRODUCING ELECTRONIC COMPONENT

(71) Applicant: TOPPAN PRINTING CO., LTD., Tokyo (JP)

(72) Inventors: Fusao Takagi, Tokyo (JP); Kiyotomo Nakamura, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 97 days.

(21) Appl. No.: 16/404,976

(22) Filed: May 7, 2019

(65) Prior Publication Data

US 2019/0269013 A1     Aug. 29, 2019

Related U.S. Application Data

(63) Continuation of application No. PCT/JP2017/043339, filed on Dec. 1, 2017.

(30) Foreign Application Priority Data

Dec. 2, 2016 (JP) .............................. JP2016-235277

(51) Int. Cl.
*H05K 1/16* (2006.01)
*H05K 1/11* (2006.01)
(Continued)

(52) U.S. Cl.
CPC .............. *H05K 1/162* (2013.01); *H01G 4/06* (2013.01); *H01G 4/12* (2013.01); *H01G 4/228* (2013.01);
(Continued)

(58) Field of Classification Search
CPC ............ H05K 1/162; H05K 1/16; H05K 3/38; H05K 3/46; H05K 2201/10378;
(Continued)

(56) References Cited

U.S. PATENT DOCUMENTS 6,201,271 B1    3/2001  Okutoh et al.
7,355,290 B2 *  4/2008  Shioga ................ H01L 21/4846
                                                                257/774

(Continued)

FOREIGN PATENT DOCUMENTS

EP       1 612 818 A    1/2006
JP       H10-320622 A   12/1998
(Continued)

OTHER PUBLICATIONS

Office Action dated Oct. 20, 2020 for corresponding Japanese Patent Application No. 2016-235277.
(Continued)

*Primary Examiner* — Ishwarbhai B Patel
(74) *Attorney, Agent, or Firm* — Foley & Lardner LLP (57) ABSTRACT

An electronic component includes a glass base in which through holes are formed passing through both surfaces thereof; an insulating resin layer laminated on each of both surfaces of the glass base and including a copper plated layer formed therein; and a capacitor including a lower electrode formed on the copper plated layer, a dielectric layer laminated on the lower electrode, and an upper electrode laminated on the dielectric layer. In the electronic component, the upper electrode has a region that is parallel to the copper plated layer and is formed so as to be smaller than a region of the dielectric layer parallel to the surface of the copper plated layer or a region of the lower electrode parallel to the surface of the copper plated layer.

4 Claims, 8 Drawing Sheets

(51) Int. Cl.

| | |
|---|---|
| *H01G 4/06* | (2006.01) |
| *H01G 4/228* | (2006.01) |
| *H01G 4/33* | (2006.01) |
| *H01L 23/15* | (2006.01) |
| *H05K 3/38* | (2006.01) |
| *H05K 3/46* | (2006.01) |
| *H01G 4/12* | (2006.01) |
| *H01G 4/38* | (2006.01) |
| *H01L 23/12* | (2006.01) |
| *H01G 4/236* | (2006.01) |
| *H01G 4/248* | (2006.01) |
| *H05K 1/02* | (2006.01) |
| *H05K 1/18* | (2006.01) |

(52) U.S. Cl.
CPC ............. *H01G 4/236* (2013.01); *H01G 4/248* (2013.01); *H01G 4/33* (2013.01); *H01G 4/38* (2013.01); *H01L 23/12* (2013.01); *H01L 23/15* (2013.01); *H05K 1/111* (2013.01); *H05K 1/16* (2013.01); *H05K 3/38* (2013.01); *H05K 3/46* (2013.01); *H05K 1/0231* (2013.01); *H05K 1/18* (2013.01)

(58) Field of Classification Search
CPC ........... H05K 2201/068; H05K 1/0271; H05K 3/4605; H01G 4/12; H01G 4/38; H01G 4/236; H01G 4/248; H01G 4/06; H01G 4/228; H01G 4/33; H01L 23/12; H01L 23/15; H01L 2224/16237; H01L 2924/15311; H01L 2924/19105; H01L 23/49822; H01L 23/49827
See application file for complete search history.

(56) References Cited

U.S. PATENT DOCUMENTS

| | | | | |
|---|---|---|---|---|
| 2005/0152098 | A1* | 7/2005 | Sakaguchi | H01G 9/028 361/523 |
| 2006/0002097 | A1 | 1/2006 | Borland et al. | |
| 2006/0022304 | A1* | 2/2006 | Rzeznik | H01G 4/08 257/532 |
| 2006/0061936 | A1* | 3/2006 | Yamasaki | H05K 1/162 361/321.3 |
| 2006/0180938 | A1 | 8/2006 | Kurihara et al. | |
| 2006/0183280 | A1 | 8/2006 | Lee et al. | |
| 2006/0254812 | A1 | 11/2006 | Borland et al. | |
| 2007/0076348 | A1* | 4/2007 | Shioga | H01G 4/30 361/307 |
| 2008/0099888 | A1 | 5/2008 | Kurihara et al. | |
| 2009/0200073 | A1* | 8/2009 | Mano | H05K 1/162 174/260 |
| 2009/0215231 | A1* | 8/2009 | Inoue | H01L 24/82 438/125 |
| 2011/0156247 | A1* | 6/2011 | Chen | H01L 23/645 257/724 |
| 2017/0103946 | A1* | 4/2017 | Chang | H01L 21/486 |

FOREIGN PATENT DOCUMENTS

| | | |
|---|---|---|
| JP | 2000-151114 A | 5/2000 |
| JP | 2001-274034 A | 10/2001 |
| JP | 2006-013353 A | 1/2006 |
| JP | 2006-253631 A | 9/2006 |
| JP | 2008-227177 A | 9/2008 |
| JP | 2009-188401 A | 8/2009 |
| JP | 2010-251530 A | 11/2010 |
| JP | 2011-129665 A | 6/2011 |

OTHER PUBLICATIONS

International Searching Authority, "International Search Report," issued in connection with International Patent Application No. PCT/JP2017/043339, dated Feb. 27, 2018.

Extended European Search Report dated Dec. 3, 2019 for corresponding Application No. 17875704.3.

Office Action dated Jan. 4, 2022 issued in corresponding Japanese Patent Application No. 2016-235277 (13 pages, English translation included).

* cited by examiner

ELECTRONIC COMPONENT AND METHOD OF PRODUCING ELECTRONIC COMPONENT

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2017/043339, filed on Dec. 1, 2017, which is based upon and claims the benefit of priority to Japanese Patent Application No. 2016-235277, filed on Dec. 2, 2016; the disclosures of which are all incorporated herein by reference in their entireties.

TECHNICAL FIELD

The present invention relates to an electronic component and a method of producing an electronic component, and in particular relates to an electronic component incorporating a capacitor that has a structure less likely to cause a short circuit and ensuring high reliability.

BACKGROUND ART

In recent years, following the trend of achieving high performance and miniaturization in electronic devices, there are growing needs of developing high-density circuit boards configuring semiconductor devices. Accordingly, there are requirements to develop fine circuit wires and miniaturizing passive components, such as resistors, capacitors or inductors. However, since there are requirements to even further miniaturize electronic devices, only miniaturization of these small passive components and high-density packaging of these components on board surfaces may not be sufficient to keep up with these requirements. As measures against such an issue, there has been proposed a technique of incorporating passive components into a mounting board (e.g., see JP H10-320622 A).

Specifically, passive components are formed by printing or vacuum deposition for incorporation into multilayer boards so that the electronic devices can be miniaturized. By forming passive components inside multilayer boards, the length of wires can be reduced, which beneficially leads to reducing high frequency noise.

As a material for such boards, an organic core board made of an organic material typified by a glass epoxy resin is used. There is also known a method of providing a cavity in an organic core board and embedding a chip capacitor in the cavity.

As a material for such boards, an electronic circuit board using a glass material is attracting attention, owing to recent technical advances in boring into glass materials. For example, through holes with a small diameter of 100 µm or less can be formed at a pitch of 150 µm or less in a glass material with a thickness of 300 µm. Circuit boards using such a glass material (termed a glass circuit board hereinafter) not only enhance packaging reliability because the glass material has a small coefficient of linear thermal expansion (CTE) in the range of 2 ppm/K to 8 ppm/K matching silicon chips, but also enable highly accurate packaging because of having good flatness.

Glass circuit boards also have good formability of fine wires and good transmission performance due to the good flatness. Furthermore, research is being conducted to apply glass materials to electronic circuit boards, utilizing good chemical stability, high flexibility, and affordable price, which are characteristic of glass materials. Such a research is raising expectations of developing such products as interposers for semiconductor devices, circuit boards for imaging devices, LC demultiplexers (diplexers) for communication devices, and the like. Electronic circuits having such glass cores are required to be provided with decoupling capacitors, LC circuits, or the like. Thus, there are growing needs of incorporating capacitors into such electronic circuits.

SUMMARY OF THE INVENTION

Boards having built-in capacitors as mentioned above have issues as set forth below. Specifically, increase in volume occupied by a chip capacitor involves limitation to routing of wires. Moreover, if an inorganic core is used, flatness of the board may be impaired due to the embedded chip capacitor. In addition, such boards having built-in capacitors may impair connection reliability due to the difference in coefficient of linear thermal expansion between the organic board and the chip component.

When forming a capacitor of a MIM (metal insulator metal) structure in a multilayer circuit using an organic core board, a short circuit or an open failure may occur in the capacitor, deteriorating reliability. This is because such an organic core board has a coefficient of linear thermal expansion that is larger than that of the dielectric layer, and may allow separation or cracking of the dielectric layer due to thermal cycling.

The present invention has been made in light of the circumstances set forth above and aims to provide a miniaturized and thin electronic component having improved or even high reliability by using a board that has a thin film capacitor of a MIM structure having improved or even high reliability, and a method of producing an electronic component.

An electronic component according to the present invention includes: a glass core base; an insulating resin layer laminated on the glass core base and including a conductor circuit formed therein; and a capacitor including a lower electrode formed on a conductor portion that configures the conductor circuit, a dielectric layer laminated on the lower electrode, and an upper electrode laminated on the dielectric layer. In the electronic component, the upper electrode has a peripheral edge that is parallel to a surface of the conductor portion and is located on the inside of both a peripheral edge of the dielectric layer and a peripheral edge of the lower electrode.

In the electronic component according to the present invention, the conductor circuit, the lower electrode, and the upper electrode are formed by laminating one or more metals selected from at least copper, nickel, palladium and titanium.

In the electronic component according to the present invention, the dielectric layer is selected from alumina, silica, silicon nitride, tantalum oxide, titanium oxide, calcium titanate, barium titanate, and strontium titanate.

An electronic component according to the present invention includes: a glass core base in which through holes are formed passing through both surfaces thereof; insulating resin layers respectively laminated on both surfaces of the glass core base and including respective conductor circuits formed therein for connection to each other via the through holes; and capacitors each including a lower electrode formed on a conductor portion that configures the corresponding one of the conductor circuits, a dielectric layer laminated on the lower electrode, and an upper electrode laminated on the dielectric layer. In the electronic component, the upper electrode has a peripheral edge parallel to a surface of the conductor portion, and is located on the inside of a peripheral edge of the dielectric layer and a peripheral edge of the lower electrode.

A method of producing an electronic component according the present invention includes: forming a conductor circuit on a surface of a glass core base; forming a lower electrode on a predetermined conductor portion in the conductor circuit; forming a dielectric layer on the lower electrode; and forming an upper electrode on the dielectric layer so as to be parallel to a surface of the conductor portion, with a peripheral edge of the upper electrode being located on the inside of a peripheral edge of the dielectric layer and a peripheral edge of the lower electrode.

According to the present invention, a glass core base is used as a core board. The glass core base has low coefficient of linear thermal expansion and high coefficient of elasticity, and thus can prevent dimensional variation due to thermal cycling, and can ensure connection reliability of the electronic circuit and the external connection terminals during thermal cycling. Furthermore, the ends of the upper electrode are ensured to be separated from the respective ends of the lower electrode, and the upper and lower electrodes are electrically isolated from each other by the dielectric layer. Thus, a short circuit is better prevented from occurring between the electrodes, and electrical reliability is enhanced.

DESCRIPTION OF REPRESENTATIVE EMBODIMENTS

With reference to the drawings, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., are different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

Figure 1:
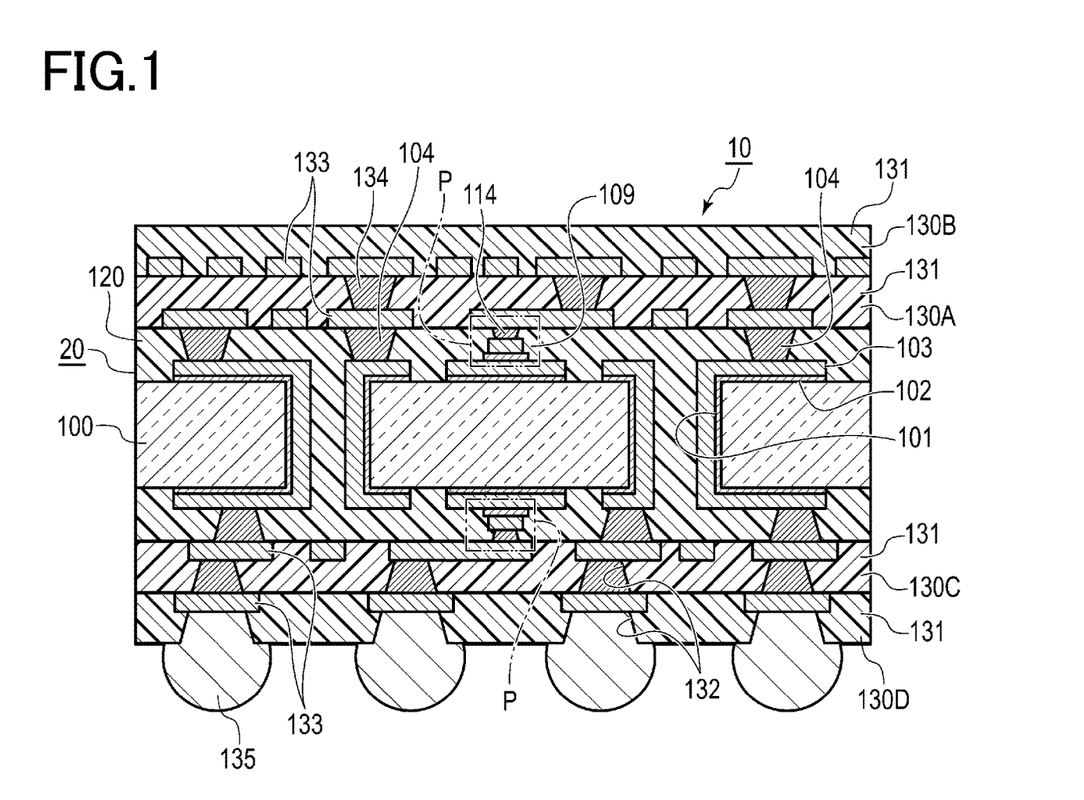
FIG. 1 is a vertical cross-sectional view illustrating a relevant part of an electronic component according to a first embodiment of the present invention.

FIG. 1 is a vertical cross-sectional view illustrating an electronic component (circuit board including built-in capacitor) 10 according to a first embodiment of the present invention. FIGS. 2 to 8 are vertical cross-sectional views illustrating a process of forming a glass core board 20 configuring the electronic component 10. FIGS. 9 to 17 are vertical cross-sectional views illustrating a process of forming a MIM capacitor 109 on the glass core board 20. The term MIM refers to metal insulator metal.

As shown in FIG. 1, the electronic component 10 includes a glass core board 20. The glass core board 20 has an upper surface on which a first upper multilayered wiring layer 130A and a second upper multilayered wiring layer 130B are laminated in this order. The glass core board 20 has a lower surface on which a first lower multilayered wiring layer 130C, and a second lower multilayered wiring layer 130D are laminated in this order.

The glass core board 20 includes a glass base 100. The glass base 100 is provided with through holes 101. Each through hole 101 has an inner wall surface over which a seed metal layer 102 is formed, extending over both surfaces of the glass base 100. The seed metal layer 102 is covered with a copper plated layer (conductor portion) 103. At predetermined positions of the copper plated layer 103, an external connection terminal 104 and a MIM capacitor 109 are respectively formed (see FIG. 17).

Figure 17:
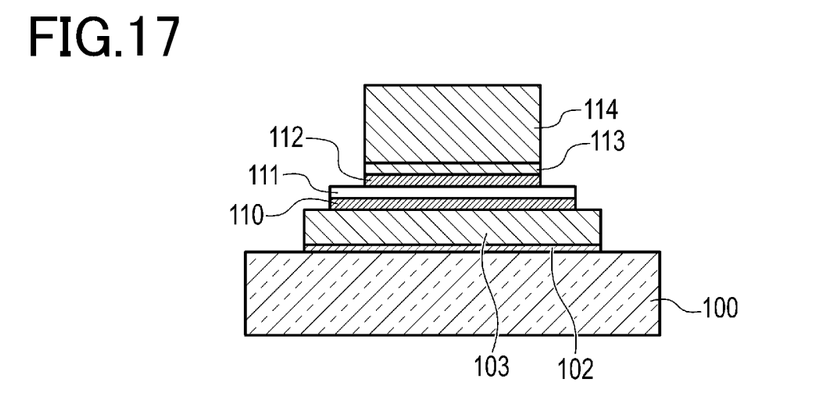
FIG. 17 is a vertical cross-sectional view illustrating a process of forming a capacitor on the glass core board.

As shown in FIG. 17, in the MIM capacitor 109, the copper plated layer 103 is provided, on the overall upper surface thereof, with a lower electrode 110, a dielectric layer 111, an upper electrode 112, and a seed metal layer 113 in this order. The seed metal layer 113 has an upper portion on which an upper conductor 114 is formed.

The glass base 100 mentioned above is provided with an insulating resin layer 120 extending over both surfaces thereof to cover the copper plated layer 103, the external connection terminal 104, and the MIM capacitor 109.

The first upper multilayered wiring layer 130A is provided with an insulating resin layer 131. In the insulating layer 131, via holes 132 and a conductor circuit 133 are formed. At a predetermined positions of the conductor circuit 133, external connection terminals 134 are formed. The same applies to the second upper multilayered wiring layer 130B, the first lower multilayered wiring layer 130C, and the second lower multilayered wiring layer 130D.

The individual elements will now be specifically described in terms of materials, shapes, and the like. The glass base 100 is made of a transparent glass material having optical transparency. The components of the glass or the ratio of the components contained in the glass, and the method of producing the glass are not particularly limited. For example, the glass may be non-alkali glass, alkali glass, borosilicate glass, quartz glass, sapphire glass, photosensitive glass, or the like. Any of these glass materials containing silicate as a main component may be used. Other glass materials may be used. However, in the semiconductor usage of the present embodiment, non-alkali glass may preferably be used. The glass base 100 may preferably have a thickness of 1 mm or less. However, for ease of forming through holes in the glass, or handling of the glass during production, the thickness may more preferably be in the range of 0.1 mm or more and 0.8 mm or less.

The method of producing the glass base 100 may be floating, down-drawing, fusion, up-drawing, rollout, or other methods. However, a glass material produced through any method may be used, and is not limited to a particular one. The glass material may preferably have a coefficient of linear expansion in the range of −1 ppm/K or more and 15.0 ppm/K or less. If the coefficient of linear expansion is less than −1 ppm/K, such glass materials are quite limited, and low cost is not ensured. If the coefficient of linear expansion exceeds 15.0 ppm/K, the difference in coefficient of thermal expansion between the dielectric material and the glass material becomes large and reliability is impaired. Moreover, if a silicon chip is mounted to the glass core board 20, connection reliability with the silicon chip is impaired. More preferably, the glass material has a coefficient of linear expansion in the range of 0.5 ppm/K or more and 8.0 ppm/K or less, and even more preferably in the range of 1.0 ppm/K or more and 4.0 ppm/K or less.

The glass base 100 may be provided in advance with a functional film, such as an antireflection film or an IR cut filter. The glass base 100 may be imparted with hardness, antistatic properties, or a function, such as coloring or texture control. Examples of such a functional film include hard-coat films for imparting hardness, antistatic films for imparting antistatic properties, optical filter films for coloring, and antiglare or light-scattering films for controlling texture, although it is not limited to these films. Such a functional film may be formed using a surface treatment technique, such as deposition, sputtering, wet processing, or the like.

The seed metal layer 102 serves as a power supply layer in electroplating when forming wiring through a semi-additive process. The seed metal layer 102, which is provided directly on the glass base 100 and on the inner wall of each through hole 101, is formed, for example, by sputtering or CVD. Examples of the material used for forming the seed metal layer 102 include Cu, Ni, Al, Ti, Cr, Mo, W, Ta, Au, Ir, Ru, Pd, Pt, AlSi, AlSiCu, AlCu, NiFe, ITO, IZO, AZO, ZnO, PZT, TiN, $Cu_3N_4$, and a Cu alloy. These materials may be used alone or in combination of two or more. On the seed metal layer 102, an electroless layer (electroless copper layer, electroless nickel layer, or the like) is formed.

The lower electrode 110 enhances adhesion between the copper plated layer 103 and the dielectric layer 111, and the upper electrode 112 enhances adhesion between the dielectric layer 11 and the seed metal layer 113. The material for the lower and upper electrodes 110 and 112 may, for example, be Ti. Besides Ti, the material may be Cu, Ni, Al, Cr, Mo, W, Ta, Au, Ir, Ru, Pd, Pt, AlSi, AlSiCu, AlCu, NiFe, or a Cu alloy. These materials may be used alone or in combination of two or more. Ti is superior from the perspective of adhesion, electrical conductivity, ease of production, or cost.

The lower and upper electrodes 110 and 112 may preferably have a thickness, for example, in the range of 10 nm or more and 1 μm or less. If the thickness is less than 10 nm, adhesive strength may be insufficient. If the thickness exceeds 1 μm, not only the time taken for film formation in the production process described later may be too long to satisfy mass productivity, but also the time taken for the process of removing unwanted portions may be long. The lower and upper electrodes 110 and 112 may more preferably have a thickness in the range of 10 nm or more and 500 nm or less. The lower and upper electrodes 110 and 112 may have a different thickness. However, the thickness may preferably be the same for simplifying the structure.

From the perspective of insulation properties and dielectric constant, the material for the dielectric layer 111 may be selected from alumina, silica, silicon nitride, tantalum oxide, titanium oxide, calcium titanate, barium titanate, and strontium titanate. The dielectric layer 111 may preferably have a thickness in the range of 10 μm or more and 1 μm or less. The dielectric layer 111 with a thickness of less than 10 nm is unlikely to maintain insulation properties and does not allow the capacitor to exhibit its functions. If the thickness of the dielectric layer 11 exceeds 1 μm, the time taken for film formation may be excessively long, or moreover, the capacitance of the capacitor may become excessively small and a desired capacity may not be obtained. The dielectric layer 111 may more preferably have a thickness in the range of 50 nm or more and 500 nm or less.

The seed metal layer 113 serves as a power supply layer when forming the upper conductor 114 on the MIN capacitor 109 through a semi-additive process. As the seed metal layer 113, for example, one made of Cu, Ni, Al, Ti, Cr, Mo, W, Ta, Au, Ir, Ru, Pd, Pt, AlSi, AlSiCu, AlCu, NiFe, or a Cu alloy may be used. These materials may be used alone or in combination of two or more. More preferably, the seed metal layer 113 may be made of copper to facilitate etching removal later. The seed metal layer 113 may preferably have a thickness in the range of 10 μm or more and 5 μm or less. If the seed metal layer 113 has a thickness of less than 100 nm, energization failure may occur during the subsequent electroplating. If the seed metal layer 113 has a thickness exceeding 5 µm, the time taken for etching removal may be long. The seed metal layer 113 may more preferably have a thickness in the range of 100 nm or more and 500 nm or less.

The upper conductor 114 is a copper plated layer. The upper conductor 114 may preferably be formed by copper electroplating from the perspective of convenience, cost, and electrical conductivity. However, besides copper plating, plating of nickel, chromium, Pd, gold, rhodium, iridium, or the like may be used.

The upper conductor 114 may preferably have a thickness in the range of 3 µm or more and 30 µm or less. A thickness of less than 3 µm may lead to loss of circuit depending on the etching following formation of the upper conductor 114. Moreover, there is a risk of deteriorating connection reliability or electrical conductivity of the circuit. If the copper electroplated layer has a thickness exceeding 30 µm, a resist layer with a thickness of 30 µm or more is required to be formed, which may increase manufacturing cost. In addition, it will be difficult to form fine wires at a pitch of 30 µm or less because resist resolution will be lowered. More preferably, the upper conductor 114 may have a thickness in the range of 5 µm or more and 25 µm or less, and even more preferably, in the range of 10 µm or more and 20 µm or less.

In the MIM capacitor 109, the upper electrode 112 is formed with a size smaller than that of the dielectric layer 111 and the lower electrode 110. With this configuration, the ends of the upper electrode 112 are separated from the respective ends of the lower electrode 110, and the ends of the former are isolated from the respective ends of the latter by the dielectric layer. Accordingly, the MIM capacitor 109 will not suffer from the occurrence of a short circuit, and will have improved or even high reliability.

The MIM capacitor 109 is formed such that the upper electrode 112 will have a size (a region parallel to the surface of the copper plated layer 103) smaller than the size (the regions parallel to the surface of the copper plated layer 103) of the dielectric layer 111 and the lower electrode 110. Specifically, the upper electrode 112 has a peripheral edge that is parallel to the surface of the copper plated layer 103 and located on the inside of the peripheral edges of the dielectric layer 111 and the lower electrode 110. With this configuration, the ends of the upper electrode 112 are separated from the respective ends of the lower electrode 110, and the ends of the former are isolated from the respective ends of the latter by the dielectric layer. Accordingly, the MIM capacitor 109 will not suffer from the occurrence of a short circuit, and will have improved or even high reliability.

Figure 2:
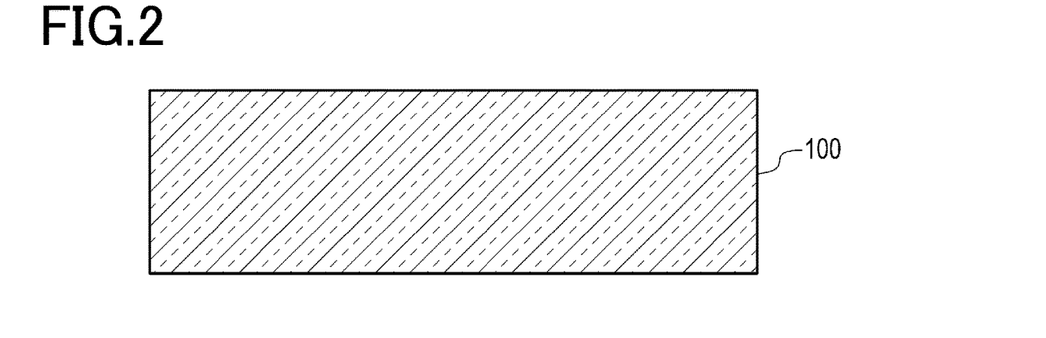
FIG. 2 is a vertical cross-cross-sectional view illustrating a production process of a glass core board configuring the electronic component.
Figure 3:
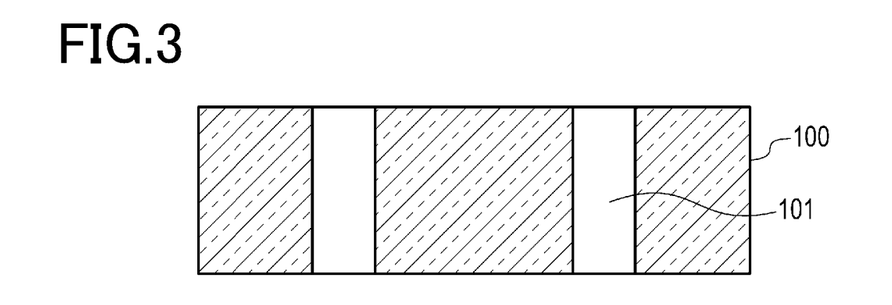
FIG. 3 is a vertical cross-cross-sectional view illustrating a production process of a glass core board configuring the electronic component.

A method of producing the electronic component 10 will be described. A glass base 100 as shown in FIG. 2 is used. As shown in FIG. 3, through holes 101 are formed in the glass base 100. Each through hole 101 may have a shape not limited to a cylindrical shape, i.e., may have any cross sectional shape or diameter. For example, each through hole 101 may have an X shape with the center diameter being smaller than the top and bottom diameters, or may have a shape with the bottom diameter being smaller than that of the top diameter, or any other shapes. Alternatively, each through hole may have a shape with the center diameter being larger than the top and bottom diameters.

The method of forming the through holes 101 may be laser processing, or electrical discharge processing, or if a photosensitive resist material is used, may be sandblasting, dry etching, or chemical etching using hydrofluoric acid or the like. A glass core board 20 may further be formed using photosensitive glass. Provision of a glass core board 20 facilitates laser or electrical discharge processing and thus is preferable from the perspective of productivity. The laser that can be used may be selected from $CO_2$ laser, UV laser, picosecond laser, femtosecond laser, and the like.

Figure 4:
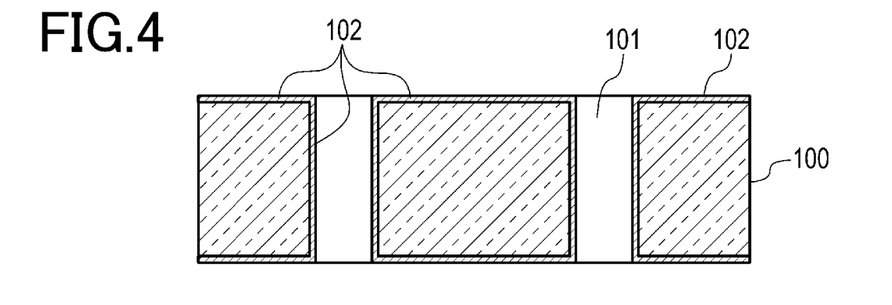
FIG. 4 is a vertical cross-sectional view illustrating a production process of a glass core board configuring the electronic component.

Then, as shown in FIG. 4, a seed metal layer 102 is formed covering surfaces of the glass base 100 and inner walls of the through holes 101. From the perspective of electrical properties, ease of manufacture and cost, the seed metal layer 102 is formed by sequentially forming a titanium layer and a copper layer, which have good adhesion with a glass material, by sputtering. The titanium layer and the copper layer for forming a circuit on the glass base 100 may preferably have a total thickness of 1 µm or less that is beneficial to forming fine wires through a semi-additive process. A total thickness exceeding 1 µm may make it difficult to form fine wires at a pitch of less than 30 µm. Subsequently, an electroless layer is formed. Compared to forming only a titanium layer and a copper layer, formation of an electroless layer enables coverage of the entirety of the inner walls of the through holes 101 with a metal film, and connection reliability of the through holes is raised.

The electroless layer may be formed by electroless copper plating, electroless nickel plating, or the like. However, due to achieving good adhesion with a glass material or a titanium and copper layers, electroless nickel plating is preferable. If the electroless nickel layer has an excessively large thickness, formation of fine wires will be difficult, or moreover, adhesion will be lowered due to the increase of film stress. Therefore, the thickness of the electroless nickel layer may preferably be 1 µm or less. More preferably, the electroless nickel layer may have a thickness of 0.5 µm or less, and even more preferably 0.3 µm or less. The electroless nickel film may contain phosphorous that is an incorporated additive derived of a reducer, or contain sulfur, lead, bismuth, or the like contained in the electroless nickel plating solution. Through the process as described above, there is obtained a board in which a seed metal layer 102 is formed on a glass base in which through holes 101 are formed (see FIG. 4).

Figure 5:
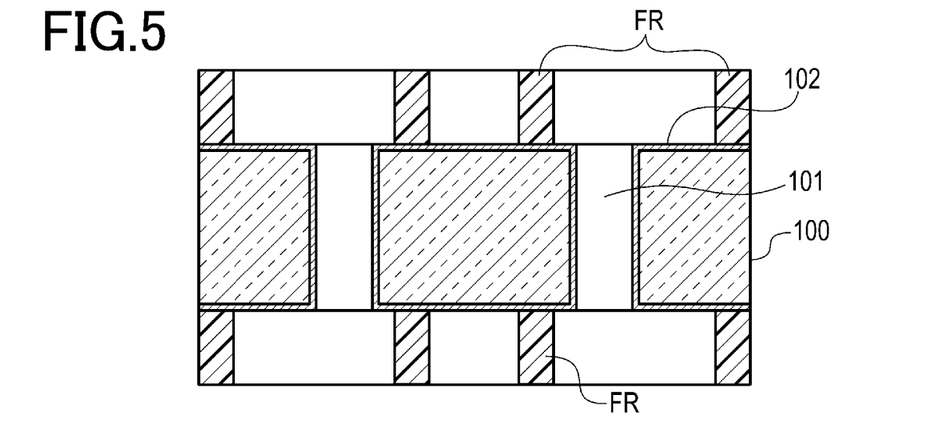
FIG. 5 is a vertical cross-sectional view illustrating a production process of a glass core board configuring the electronic component.

Then, as shown in FIG. 5, a photoresist pattern FR is formed. In the method of forming the photoresist pattern FR, for example, a photoresist layer is formed on the overall surface of the seed metal layer 102. The photoresist layer to be formed may be made of a negative dry film resist, a negative liquid resist, or a positive liquid resist. From the perspective of ease and cost of forming the resist layer, a negative photoresist may preferably be used. The method of forming the resist layer may, for example, be roll lamination or vacuum lamination if a negative dry film resist is used. If a liquid negative resist or a positive resist is used, the method may be selected from slit coating, curtain coating, die coating, spray coating, electrostatic coating, inkjet coating, gravure coating, screen printing, gravure offset printing, spin coating, and doctor coating. The method of forming the resist layer is not limited to ones mentioned above.

Then, a desired circuit pattern is formed in the photoresist layer by generally used photolithography. When forming the resist pattern FR, alignment is made such that portions for forming copper plated layers 103 later will be exposed, followed by exposure and development. The resist may preferably have a thickness in the range of 5 µm or more and 25 µm or less, although it depends on the thickness of electroplating performed in later processing. If the resist layer has a thickness of less than 5 µm, an electroplated layer that will serve as a conductor circuit layer cannot have a thickness of 5 µm or more, and accordingly connection reliability of the circuit may be deteriorated. If the thickness of the resist layer is larger than 25 µm, fine wires at a pitch of 30 µm or less are unlikely to be formed. Thus, a glass core board 20 is obtained with a photoresist pattern FR being formed as shown in FIG. 5.

Figure 6:
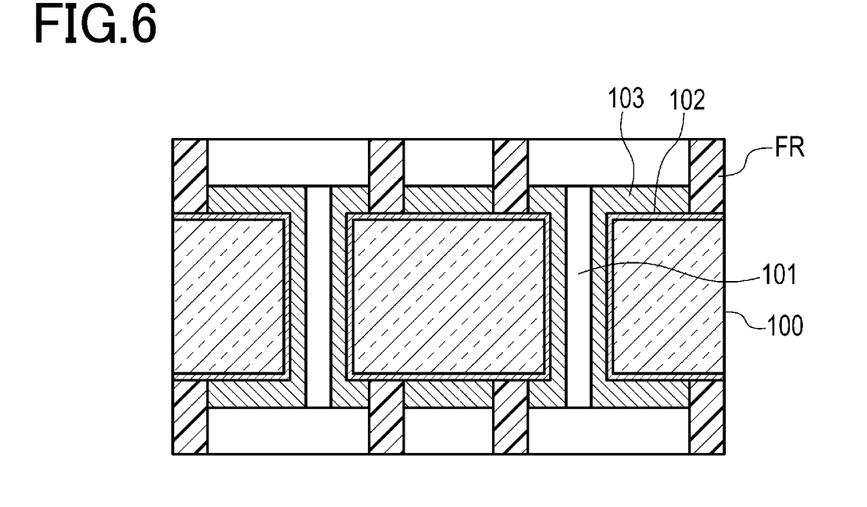
FIG. 6 is a vertical cross-sectional view illustrating a production process of a glass core board configuring the electronic component.

Then, as shown in FIG. 6, a copper plated layer 103 is formed by electroplating. The electroplating may preferably be copper electroplating, from the perspective of ease, cost, and electrical conductivity. The copper electroplating may preferably be conducted with a thickness in the range of 3 µm or more and 30 µm or less. If the copper electroplating is conducted with a thickness of less than 3 µm, there is a risk of losing the circuit depending on the etching performed later, or moreover, there is a risk of deteriorating connection reliability or electrical conductivity of the circuit. If the copper electroplating is conducted with a thickness exceeding 30 µm, the resist layer is required to be formed with a thickness of 30 µm or more, which may increase manufacturing cost. In addition, it will be difficult to form fine wires at a pitch of 30 µm or less because resist resolution will be lowered. More preferably, the copper electroplating may be conducted with a thickness in the range of 5 µm or more and 25 µm or less. Even more preferably, the copper electroplating may be conducted with a thickness in the range of 10 µm or more and 20 µm or less.

Besides copper electroplating, electroplating of nickel, chromium, Pd, gold, rhodium, iridium, or the like may be used.

Figure 7:
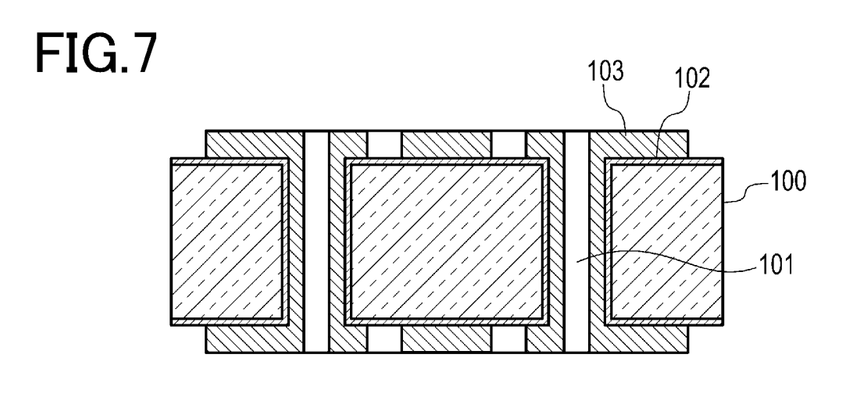
FIG. 7 is a vertical cross-sectional view illustrating a production process of a glass core board configuring the electronic component.

Then, as shown in FIG. 7, after forming wiring by electroplating, the resist layer that is no longer necessary is removed to expose the seed metal layer 102. The method of removing the resist may, for example, be a generally used known separation and removal method using an alkali solution, although it is not limited to this method.

Figure 8:
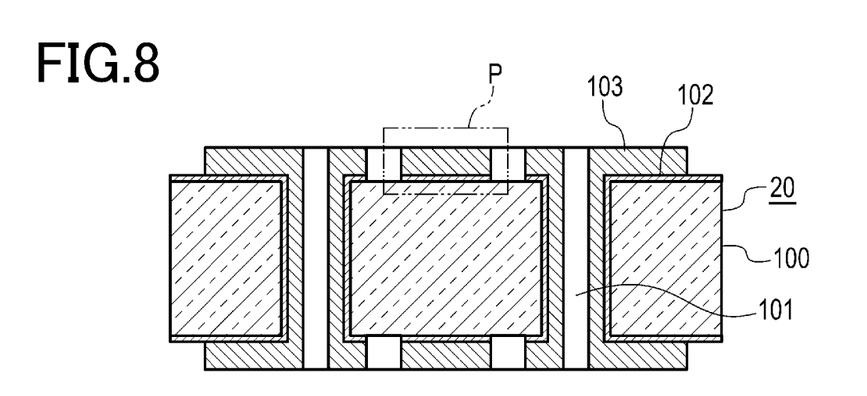
FIG. 8 is a vertical cross-sectional view illustrating a production process of a glass core board configuring the electronic component.

Then, as shown in FIG. 8, the seed metal layer 102 is removed to electrically disconnect the circuit, thereby forming an electronic circuit layer on the glass board 100. The method of removing the seed layer may be chemical etching of sequentially removing the electroless Ni layer, the copper layer, and the titanium layer. The method of removing the seed layer and the etching solution to be used are not limited.

Referring now to FIGS. 9 to 17, a method of producing a MIM capacitor 109 in a glass core board 20 will be described. FIGS. 9 to 17 are each an enlarged view of the region indicated by the dash-dot-dot line P of FIG. 8.

Figure 9:
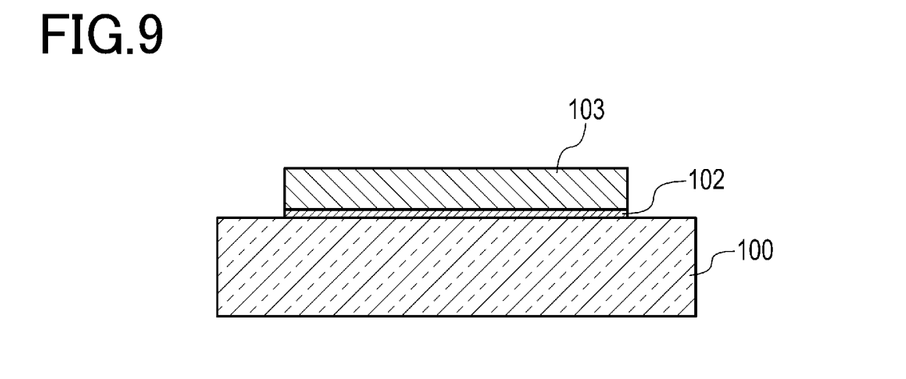
FIG. 9 is a vertical cross-sectional view illustrating a process of forming a capacitor on the glass core board.
Figure 10:
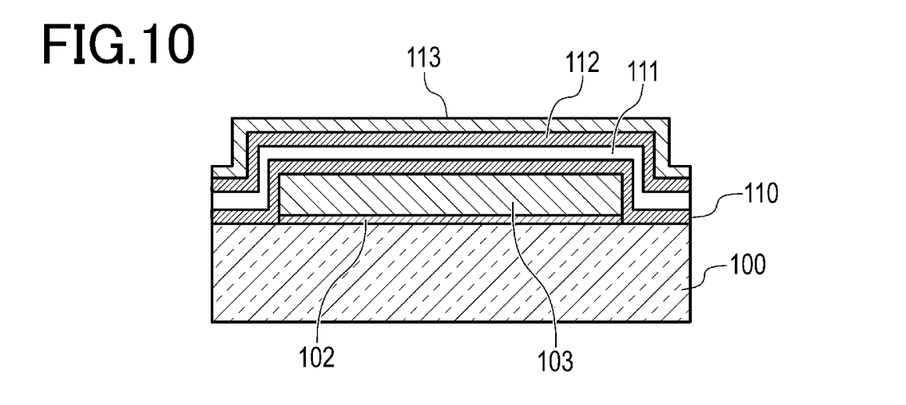
FIG. 10 is a vertical cross-sectional view illustrating a process of forming a capacitor on the glass core board.

The copper plated layer 103 of FIG. 9 has been formed as described above, and forms part of a conductor circuit layer. As shown in FIG. 10, thin films of a lower electrode 110, a dielectric layer 111, an upper electrode 112, and a seed metal layer 113 are sequentially formed on the overall surface of the copper plated layer 103. The method of forming the thin films may, for example, be a generally used method, such as vacuum deposition, sputtering, ion plating, MBE, laser ablation, CVD, or the like. Other thin film forming methods may be used.

Figure 11:
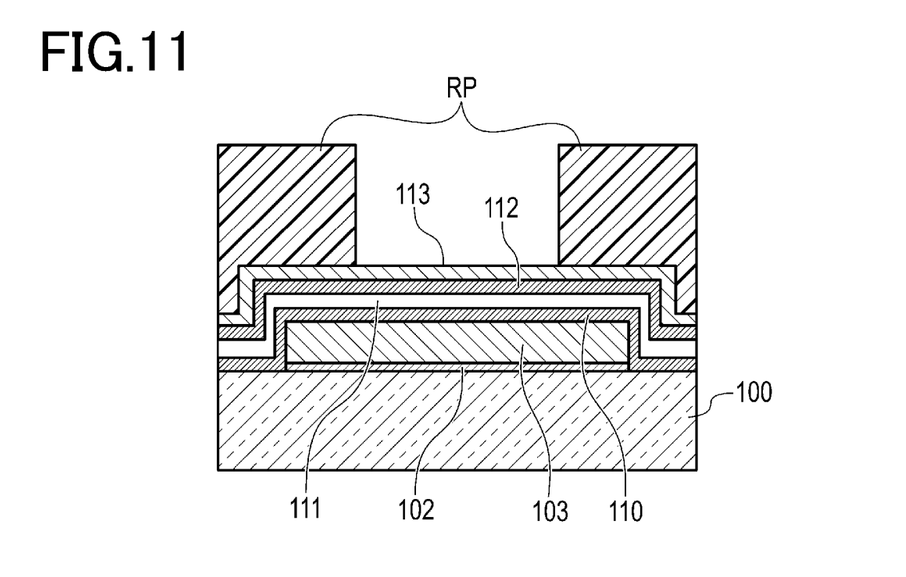
FIG. 11 is a vertical cross-sectional view illustrating a process of forming a capacitor on the glass core board.
Figure 12:
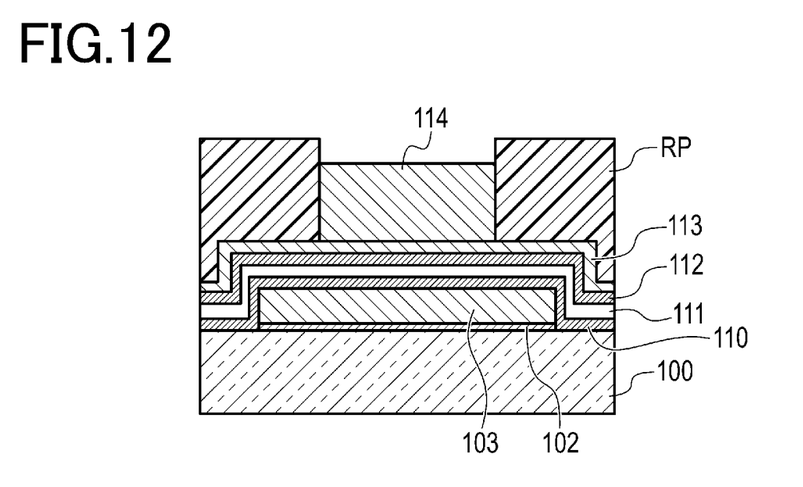
FIG. 12 is a vertical cross-sectional view illustrating a process of forming a capacitor on the glass core board.

Then, as shown in FIG. 11, a photoresist pattern RP is formed. Then, as shown in FIG. 12, an upper conductor 114 is formed by electroplating using the seed metal layer 113. The electroplating may be of nickel, copper, chromium, Pd, gold, rhodium, iridium, or the like. However, copper electroplating is preferable from the perspective of ease, cost, and electrical conductivity.

Figure 13:
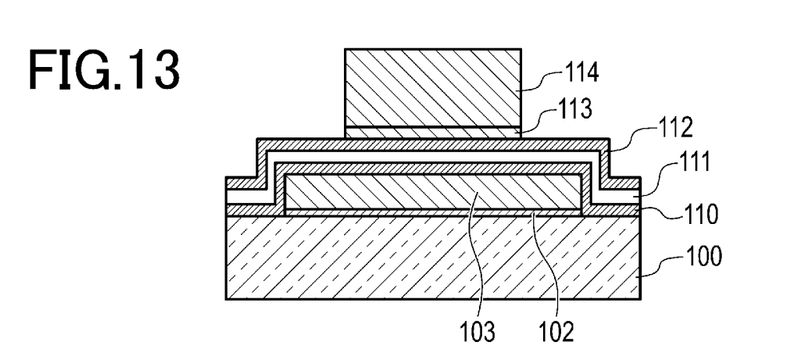
FIG. 13 is a vertical cross-sectional view illustrating a process of forming a capacitor on the glass core board.

Then, as shown in FIG. 13, unnecessary portions of resist pattern RP are removed, followed by removing unnecessary portions of the seed metal layer 113. The resist pattern RP is separated and removed by using a known alkali solution. The seed metal layer 113 may be removed by using a known chemical etching solution. Dry etching may be used for the removal.

Figure 14:
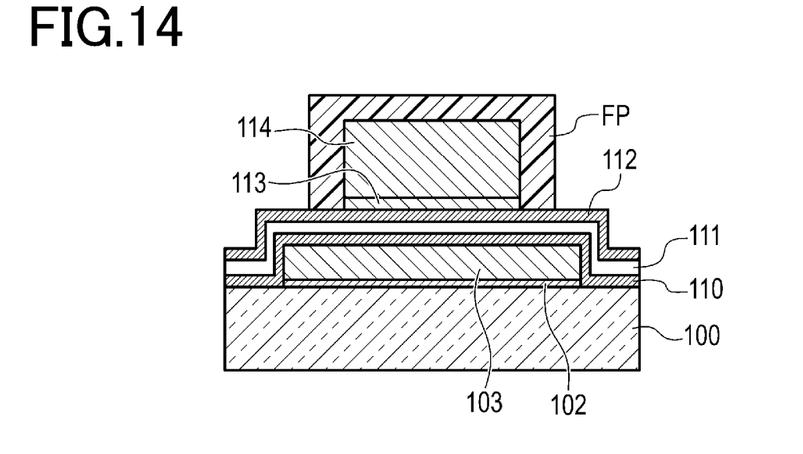
FIG. 14 is a vertical cross-sectional view illustrating a process of forming a capacitor on the glass core board.
Figure 15:
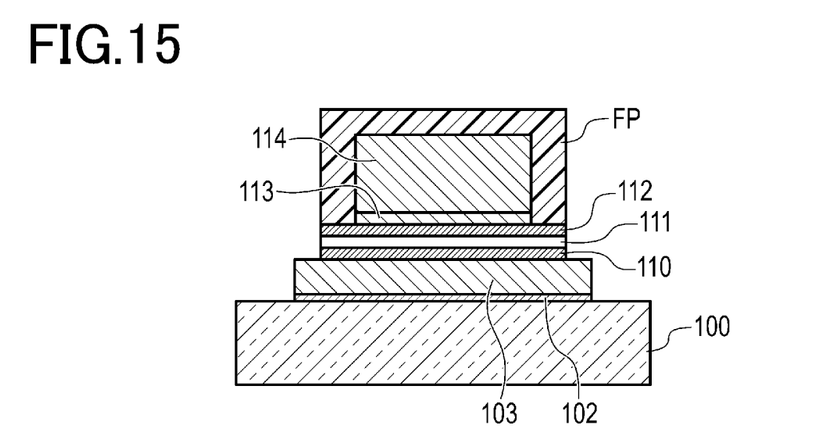
FIG. 15 is a vertical cross-sectional view illustrating a process of forming a capacitor on the glass core board.

Then, as shown in FIG. 14, a photoresist pattern FR is formed. As shown in FIG. 15, unnecessary portions of the lower electrode 110, the upper electrode 112, and the dielectric layer 111 are removed using the photoresist pattern FP as a resist layer. The method of removing the lower electrode 110, the upper electrode 112 and the dielectric layer 111 may be a known method, such as chemical etching or dry etching, although it is not particularly limited to these methods.

Figure 16:
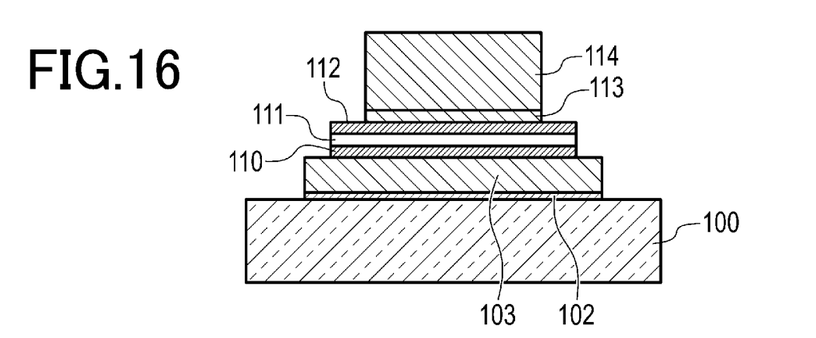
FIG. 16 is a vertical cross-sectional view illustrating a process of forming a capacitor on the glass core board.

Then, as shown in FIG. 16, the unnecessary photoresist pattern FR is removed. In the structure of the MIM capacitor 109 at this stage, the lower and upper electrodes 110 and 112 are of the same size (regions over the copper plated layer 103 align with each other). Specifically, the upper electrode 112 has a peripheral edge which is parallel to the surface of the copper plated layer 103, and aligns with the peripheral edges of the dielectric layer 111 and the lower electrode 110. In this case, the ends of the upper electrode 112 are separated from the respective ends of the lower electrode 110 only by a distance corresponding to the thickness of the dielectric layer 111. Therefore, a short circuit may occur between the lower and upper electrodes 110 and 112. For this reason, unnecessary portions of the upper electrode 112 are removed in the processing shown in FIG. 17. As a result, in the produced MIM capacitor 109, the size (the region parallel to the surface of the copper plated layer 103) of the upper electrode 112 can be made smaller than the size (the regions parallel to the surface of the copper plated layer 103) of the dielectric layer 111 and the lower electrode 110. Specifically, the upper electrode 112 has a peripheral edge that is parallel to the surface of the copper plated layer 103 and located on the inside of the peripheral edges of the dielectric layer 111 and the lower electrode 110.

Through this processing, the ends of the upper electrode 112 can be separated from the respective ends of the lower electrode 110, and the ends of the former are isolated from the respective ends of the latter by the dielectric layer 111. Thus, the resultantly formed MIM capacitor 109 will have no short circuits, and improved or even high reliability may be ensured.

Referring to FIG. 1, a description will be given of a method of forming multilayered wiring in the first upper multilayered wiring layer 130A, the second upper multilayered wiring layer 130B, the first lower multilayered wiring layer 130C, and the second lower multilayered wiring layer 130D.

Examples of resins that can be used as the insulating resin layers 120 and 131 may include epoxy resins, polyimides, maleimide resins, polyethylene terephthalate, polyphenylene oxides, liquid crystal polymers, and composites of these materials, and photosensitive polyimide resins, photosensitive polybenzoxazole, and photosensitive acrylic or epoxy resins. If a sheet-like resin is used, the method of forming the insulating resins may be vacuum lamination, vacuum pressing, or roll lamination, although not limited to these methods. If a liquid resin is used, the method may be selected from slit coating, curtain coating, die coating, spray coating, electrostatic coating, inkjet coating, gravure coating, screen printing, gravure offset printing, spin coating, and doctor coating. When forming an outermost resin layer, a solder resist may be used.

The insulating resin layers 120 and 131 may each preferably have a thickness in the range of 5 µm or more and 50 µm or less. If the thickness exceeds 50 µm, it is difficult for the via holes 132 formed in the insulating layers to have a small diameter. Accordingly, high-density wiring is not necessarily achieved. If the thickness is less than 5 µm, it may be difficult to ensure insulation between layers.

If a non-photosensitive insulating resin is used, the via holes 132 in each insulating layer 131 may be formed by laser processing. The laser may be $CO_2$ laser, UV laser, picosecond laser, femtosecond laser, or the like. Preferably, the laser may be UV laser or $CO_2$ laser due to ease of use.

If a photosensitive insulating resin is used, the via holes 132 may be formed by photolithography. After forming the via holes, the resultant object may preferably be desmeared appropriately using a permanganic acid solution to roughen the resin surfaces and clean the via holes, so that adhesion with the copper plated layer 103 is improved. Alternatively, the resultant object may be plasma-treated to clean the resin surfaces and the via holes.

Furthermore, the external connection terminals 134 may be surface-treated. The surface treatment may improve bondability with solder balls 135. In the surface treatment, a plated film of tin or a tin alloy, an electroless Ni—P/electroless Pd—P/Au film, an electroless Ni—P/Au film, or the like may be formed. Alternatively, pre-soldering treatment, or organic coating treatment, such as OSP (organic solderability preservation), may be performed. The solder balls 135 may be formed by screen printing, a solder ball transfer and mounting method, electroplating, or the like. The solder balls may be composed of tin, silver, copper, bismuth, lead, zinc, indium, antimony, or the like. These metallic materials may be used singly or in combination of two or more, and may be contained at any ratio. Instead of solder, pads for wire bonding may be provided.

Besides the methods mentioned above, the insulating resin layer 131, the via holes 132, and the copper plated layer 103 may be repeatedly formed using a known semi-additive process or a subtractive process to thereby form multilayered wiring.

The description set forth above has been provided by way of an example of forming a MIM capacitor 109 on a conductor circuit formed on the glass base 100. However, the structure should not be limited to this structure.

According to the electronic component 10 of the present embodiment, a glass material having low coefficient of linear thermal expansion and high coefficient of elasticity is used as a core board to obtain a capacitor built-in circuit board that is less likely to cause dimensional variation due to thermal cycling. Thus, connection reliability is ensured for both the electronic circuit and the external connection terminals during thermal cycling. Furthermore, in the capacitor formed of lower and upper electrodes, and a dielectric layer sandwiched therebetween, the upper electrode is formed so as to be smaller than the dielectric layer and the lower electrode. Thus, the ends of the upper electrode are ensured to be electrically isolated from the respective ends of the lower electrode by the dielectric layer to prevent the occurrence of a short circuit between the electrodes, and to thereby enhance electrical reliability.

Figure 18:
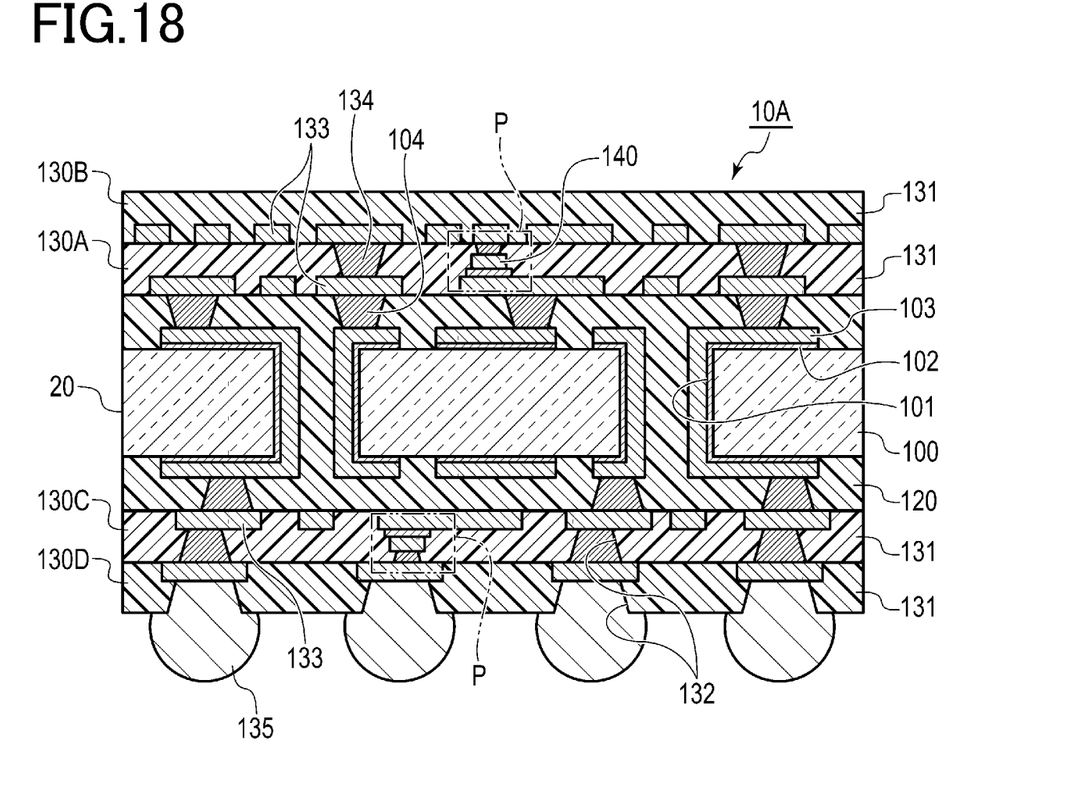
FIG. 18 is a vertical cross-sectional view illustrating a relevant part of an electronic component according to a second embodiment of the present invention.

FIG. 18 is a vertical cross-sectional view illustrating an electronic component 10A according to a second embodiment of the present invention. In the following description, identical elements or elements with identical functionality with those shown in FIG. 1 will be given the same reference signs to omit duplicate description.

In the electronic component 10A, a MIM capacitor 140 having a configuration similar to that of the MIM capacitor 109 is formed in a first upper multilayered wiring layer 130A laminated and arranged on a glass core board 20. Specifically, the MIM capacitor may be formed on the glass core board 20, or may be provided in another multilayered wiring layer that is laminated on the glass core board 20.

Figure 19:
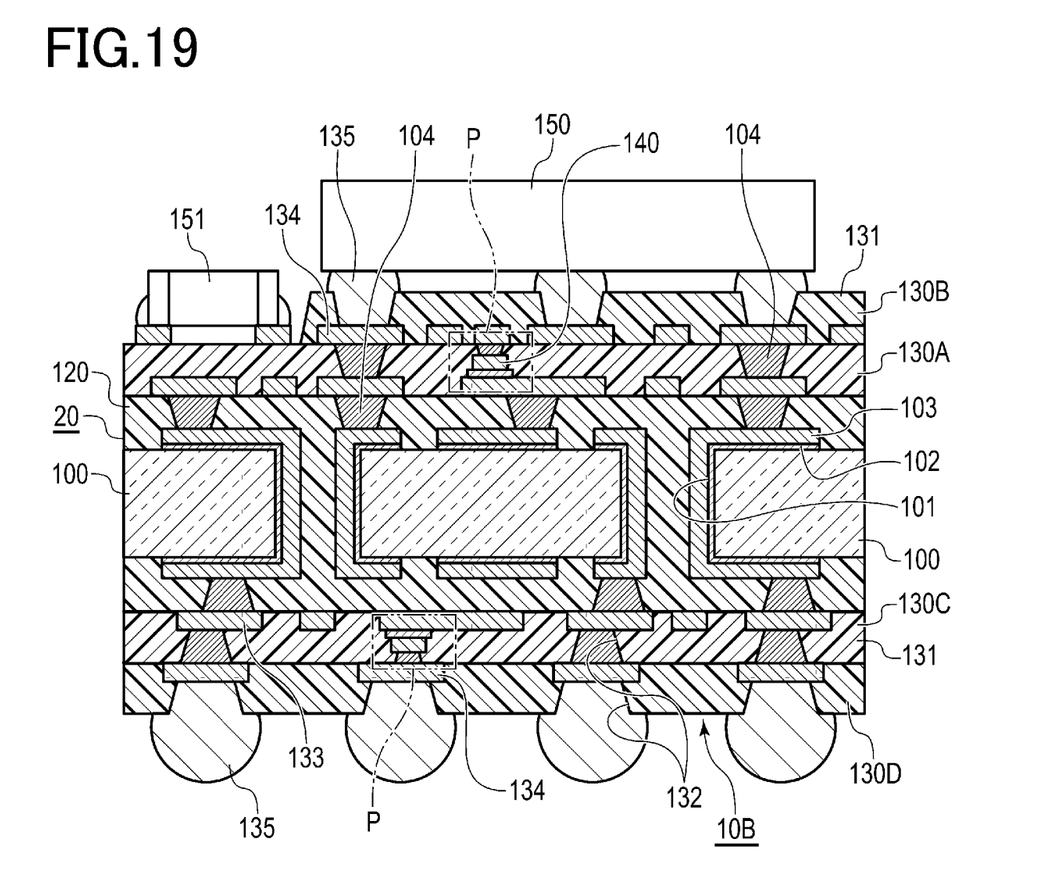
FIG. 19 is a vertical cross-sectional view illustrating a relevant part of an electronic component according to a third embodiment of the present invention.

FIG. 19 is a vertical cross-sectional view illustrating an electronic component 10B according to a third embodiment of the present invention. In the following description, identical elements or elements with identical functionality with those shown in FIGS. 1 and 18 will be given the same reference signs to omit duplicate description.

The electronic component 10B may be provided with solder balls 135 on both surfaces thereof. The electronic component 10B may further include a semiconductor chip 150 or a chip component 151.

EXAMPLES

Example 1

A glass base 100 (OA-10G with a thickness of 0.5 mm and a coefficient of linear thermal expansion of 3 ppm/K, manufactured by Nippon Electric Glass Co., Ltd.) as shown in FIG. 2 was used. Subsequently, as shown in FIG. 3, through holes 101 were formed with a top diameter of 80 μm and a bottom diameter of 60 μm by using a picosecond laser beam machine. Then, as shown in FIG. 4, a titanium film with a thickness of 50 nm and a copper film with a thickness of 300 nm were formed by sputtering on the front and back surfaces of the glass base 100 so as to serve as a seed metal layer 102. Then, an electroless nickel layer was formed with a thickness of 0.1 μm to increase the thickness of the seed metal layer 102 in the respective through holes 101. Thus, a seed metal layer 102 of titanium, copper and nickel was formed.

Then, as shown in FIG. 5, a photosensitive dry film resist with a thickness of 25 μm was provided onto the seed metal layer 102 by roll lamination, and a resist pattern FR was formed by photolithography. Then, as shown in FIG. 6, a copper plated layer 103 with a thickness of 15 μm was formed, followed by separating the resist pattern FR in an alkali solution, thereby obtaining a board shown in FIG. 7. Furthermore, the Ni, Cu and Ti layers of the seed metal layer 102 were dissolved and removed by sequentially and respectively using an etching mixture of nitric acid and hydrogen peroxide, an etching mixture of sulfuric acid and hydrogen peroxide, and an etching mixture of potassium hydroxide and hydrogen peroxide to thereby obtain a glass core board 20 shown in FIG. 8.

Then, a layer of Ti/alumina/Ti/Cu serving as a MIM capacitor 109 with a thickness of 50 nm/100 nm/50 nm/300 nm was formed, as shown in FIG. 10, on the overall surface of the copper plated layer 103 formed on the glass core board 20 shown in FIG. 9. Then, a dry film resist was formed on the overall surface of the copper plated layer 103 by vacuum lamination.

Then, as shown in FIG. 11, a resist pattern RP was formed by generally used photolithography, followed by forming an upper conductor 114 of the MIM capacitor 109 by copper electroplating with a thickness of 10 μm. Then, the resist pattern RP was separated and removed using an alkali solution, followed by dissolving and removing the seed metal layer 113 for forming the MIM capacitor by using an etching solution of sulfuric acid and hydrogen peroxide (FIG. 13). Then, as shown in FIG. 15, a dry film resist FP was formed on the upper conductor 114, followed by patterning to thereby obtain a board with the upper conductor 114 being protected.

Then, as shown in FIG. 16, the upper electrode 112, the dielectric layer 111, and the lower electrode 110 were removed by dry etching (FIG. 16). Finally, the upper electrode 112, i.e. the titanium layer, was removed by etching using an etching solution of potassium hydroxide and hydrogen peroxide, thereby obtaining a MIM capacitor 109.

The region of the upper electrode 112 parallel to the surface of the copper plated layer (conductor portion) 103 was made smaller than the region of the dielectric layer 111 parallel to the surface of the copper plated layer 103 or the region of the lower electrode 110 parallel to the surface of the copper plated layer 103.

Furthermore, an insulating resin layer 131, i.e. GX-T31 (manufactured by Ajinomoto Fine-Techno Co., Inc.) as a built-up resin with a thickness of 40 μm was formed on each of the front and back surfaces of the glass core board 20, followed by forming via holes 132 with a diameter of 60 μm by using a UV laser beam machine. Then, desmearing and electroless copper plating were performed to form an electroless copper layer with a thickness of 0.8 μm, followed by forming a dry film resist layer with a thickness of 25 μm on each of the front and back surfaces.

After forming a resist pattern by photolithography, electroless copper plating was performed to form a multilayered conductor circuit layer with a thickness of 15 μm on each of the front and back surfaces. Formation of the multilayered circuit described above was repeated to form a two-layer built-up multilayered circuit on the glass core wiring on each of the front and back surfaces. The outermost layer of each of the front and back surfaces was provided with a solder resist layer which was subjected to photolithography to expose the external connection terminals, thereby obtaining a MIM capacitor 109 of the example of the present invention. Furthermore, the surfaces of the external connection terminals 134 shown in FIG. 1 were nickel-gold plated, and respective solder balls 135 were further formed. Thus, an electronic component 10 incorporating a MIM capacitor 109 was produced.

Comparative Example 1

As Comparative Example 1, an electronic component incorporating a MIM capacitor 109 was prepared through the processes shown in FIGS. 2 to 15. In this example, each MIM capacitor 109 had an upper electrode 112, a dielectric layer 111, and a lower electrode 110 of the same size (regions parallel to the surface of the copper plated layer 103) as in FIG. 16. The production method was the same as that of Example 1 described above, except that the process shown in FIG. 17 was not performed. In this case, the ends of the upper electrode 112 were separated from the respective ends of the lower electrode 110 only by the thickness 100 nm of the dielectric layer 11.

Comparative Example 2

As Comparative Example 2, an electronic component was prepared using a generally used glass epoxy board with a thickness of 0.5 mm (coefficient of linear thermal expansion of 18 ppm/K). Through holes 101 with a diameter of 100 μm were formed by using a drilling machine. In the process shown in FIG. 4, a seed metal layer 102 was formed by electroless copper plating. With the rest of the process being the same as in Example 1, an electronic component incorporating a MIM capacitor 109 was produced.

1,000 cycles of liquid bath thermal shock tests were conducted under temperatures of −40° C. to 125° C. (30 min under high temperatures and 30 min under low temperatures) using the boards of Example 1 and Comparative Examples 1 and 2. The results are shown in Table 1.

TABLE 1

| | Plane and board structure | Results |
|---|---|---|
| Example 1 | Glass core board Upper electrode is smaller than lower electrode in MIM capacitor. | Good connection reliability and insulation properties are exhibited. |
| Comparative Example 1 | Glass core board Upper and lower electrodes have the same size in MIM capacitor. | Short circuit occurs between upper and lower electrodes in MIM capacitor. |
| Comparative Example 2 | Organic core board Upper electrode is smaller than lower electrode in MIM capacitor. | Corner cracking occurs in through holes. Separation occurs in MIM capacitor. |

According to the results shown in Table 1, Example 1 showed no separation between layers even after thermal shock tests. Variation in wire resistance was tracked every 100 cycles, and good results of the variation being within ±3% were obtained. Similarly, variation in capacity of the MIM capacitor 109 was tracked, and good results of the variation being within ±3% were similarly obtained.

As a result of the thermal shock tests, Comparative Example 1 showed good results of the variation of wiring resistance being within ±3%; however, showed abrupt lowering in the capacitance of the MIM capacitor 109 after 200 cycles. As a result of analyzing the failures, a short circuit was confirmed between the upper and lower electrodes 112 and 110.

As a result of the thermal shock tests, Comparative Example 2 showed abrupt rise in the variation of wiring resistance after 500 cycles, and showed abrupt lowering in the capacity of the MIM capacitor 109 after 200 cycles. As a result of analyzing the failures, disconnection was confirmed at corners of the through holes of the glass epoxy board, and separation was confirmed between the upper and lower electrodes 112 and 110 of the MIM capacitor 109. As a result of searches, it was found that these failures were triggered by linear thermal expansion of the organic board.

Industrial Applicability. According to the present invention, an electronic component can be produced with improved or even high reliability by forming a MIM capacitor on a glass core board, and the electronic component can be applied to semiconductor packaging boards, interposers, boards for optical devices, or the like.

What is claimed is:
1. An electronic component, comprising:
 a glass base having a first surface and a second surface opposite to the first surface, the glass base comprises through holes extending between the first surface and the second surface,
 a first layer laminated on the first surface of the glass base, the first layer comprises (a) an insulating resin; (b) a copper plated layer on the first surface of the glass base and (c) a capacitor on the copper plated layer,
 a second layer laminated on the first layer opposite to the glass base, the second layer comprises (a) an insulating resin and (b) a conductor circuit,
 a third layer laminated on the second surface of the glass base, the third layer comprises (a) an insulating resin; (b) a copper plated layer on the second surface of the glass base and (c) a capacitor on the copper plated layer, and
 a fourth layer laminated on the third layer opposite to the glass base, the third layer comprises (a) an insulating resin and (b) a conductor circuit, wherein in each of the first layer and the third layer, the capacitor comprises a lower electrode, a dielectric layer on the lower electrode and an upper electrode laminated on the dielectric layer, the upper electrode of the capacitor in the first layer has electric contact with the conductor circuit of the second layer;

the upper electrode of the capacitor in the third layer has electric contact with the conductor circuit of the fourth layer;

in each of the first layer and the third layer, a surface area of the upper electrode parallel to the first surface or the second surface of the glass base is smaller than a respective surface area of the dielectric layer and a respective surface area of the lower electrode and a surface area of the copper plated layer parallel to the first surface or the second surface of the glass base is greater than a respective surface area of the lower electrode.

2. The electronic component of claim 1, wherein the conductor circuit, the lower electrode, the upper electrode, and the upper conductor are formed by laminating one or more metals selected from at least copper, nickel, palladium and titanium.

3. The electronic component of claim 1, wherein the dielectric layer is selected from alumina, silica, silicon nitride, tantalum oxide, titanium oxide, calcium titanate, barium titanate, and strontium titanate.

4. The electronic component of claim 1, wherein a coefficient of linear expansion of the glass base is 1.0 ppm/K or more and 4.0 ppm/K or less.

* * * * *